United States Patent
Chikusa et al.

(10) Patent No.: US 8,313,577 B2
(45) Date of Patent: Nov. 20, 2012

(54) APPARATUS FOR PRODUCING SINGLE CRYSTAL SILICON

(75) Inventors: Noboru Chikusa, Yokkaichi (JP); Teruhisa Kitagawa, Suzuka (JP); Masaki Ito, Yokkaichi (JP); Takanori Ito, Ichinomiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 960 days.

(21) Appl. No.: 12/343,798

(22) Filed: Dec. 24, 2008

(65) Prior Publication Data

US 2009/0158996 A1  Jun. 25, 2009

(30) Foreign Application Priority Data

Dec. 25, 2007  (JP) ................. 2007-331548

(51) Int. Cl.
*C30B 35/00* (2006.01)
*C30B 11/00* (2006.01)
*C30B 15/00* (2006.01)
*C30B 21/06* (2006.01)
*C30B 27/02* (2006.01)
*C30B 28/10* (2006.01)
*C30B 30/04* (2006.01)

(52) U.S. Cl. ........ 117/216; 117/200; 117/204; 117/206; 117/208

(58) Field of Classification Search .......... 117/200, 117/204, 206, 208, 216
See application file for complete search history.

(56) References Cited

U.S. PATENT DOCUMENTS

| | | | | |
|---|---|---|---|---|
| 3,620,682 A * | 11/1971 | Keller | .......................... | 117/216 |
| 3,935,059 A | 1/1976 | Ayel | | |
| 4,092,124 A * | 5/1978 | Stut | .............................. | 117/222 |
| 4,499,354 A | 2/1985 | Hill et al. | | |
| 5,499,598 A * | 3/1996 | Oda | ................................ | 117/49 |
| 5,556,461 A * | 9/1996 | Kimura et al. | .................. | 117/51 |
| 6,251,182 B1 | 6/2001 | Luna et al. | | |
| 7,635,413 B2 * | 12/2009 | Kusunoki et al. | ............... | 117/13 |

FOREIGN PATENT DOCUMENTS

DE 2557186 A1 6/1977

OTHER PUBLICATIONS

Office Action dated Aug. 30, 2011, issued for the Chinese patent application No. 200810184947.7 and English translation thereof.
European Search Report dated Mar. 1, 2010, issued on the corresponding European Patent Application No. 08172934.5.

* cited by examiner

*Primary Examiner* — James McDonough
(74) *Attorney, Agent, or Firm* — Leason Ellis LLP.

(57) ABSTRACT

An apparatus for producing single crystal silicon comprising: an induction heating coil that is disposed around the polycrystalline silicon rod for fusing the polycrystalline silicon rod; an exothermic ring that has a quartz-coated member covering the conductive member; a support member that supports the exothermic ring and passes through a wall of the housing in a rotatable manner; an operating device that rotates the support member and reciprocates the exothermic ring between a heating position where the exothermic ring is positioned close to the induction heating coil and a stand-by position where the exothermic ring is receded from the heating position; a sealing member that is provided between the wall of the housing and the support member and maintains the hermitic therebetween; and a cooling flow path that is formed in the support member and flows a cooling medium.

5 Claims, 5 Drawing Sheets

APPARATUS FOR PRODUCING SINGLE CRYSTAL SILICON

BACKGROUND OF THE INVENTION

1. Field of the Invention

The present invention relates to an apparatus for producing single crystal silicon, and specifically, to an apparatus for producing single crystal silicon in which the single crystal is grown using the FZ method.

Priority is claimed on Japanese Patent Application No. 2007-331548, filed Dec. 25, 2007, the content of which is incorporated herein by reference.

2. Description of Related Art

The apparatus disclosed in Japanese Patent Application, First Publication No. Hei 7-10681 is a conventionally known example of an apparatus for producing single crystal silicon in which this type of FZ (float zone) method is employed. This apparatus for producing single crystal silicon is provided with a housing which has an inert gas environment internally; a polycrystal holder that is installed to an upper drive shaft (positioning rod) inside the housing, and which holds at its bottom end the polycrystalline silicon rod that is the sample material; a seed crystal holder that is installed to a lower drive shaft (positioning rod), and which holds at its top end the seed crystal for the silicon single crystal; and a high-frequency induction heating coil that is provided at a central area inside the housing. In this apparatus for producing single crystal silicon, the polycrystalline silicon rod which is the starting material is held by the polycrystal holder above and the seed crystal for the silicon single crystal is held by the seed crystal holder. With this arrangement in place, the high-frequency induction heating coil is then employed to melt and fuse one end of the polycrystalline silicon to the seed crystal. Thereafter, the polycrystalline silicon rod is rotated relative to the high-frequency induction heating coil and undergoes relative displacement in the axial direction. A single crystal silicon rod is thereby produced by sequential zone melting of the polycrystalline silicon rod in the axial direction.

This apparatus for producing single crystal silicon is provided with a high-frequency induction heating coil as instruments for heating the polycrystalline silicon rod. Because the polycrystalline silicon rod has a high specific resistance when it is cold, an exothermic ring (susceptor) comprising carbon, etc., is provided for preheating the polycrystalline silicon in an initial step by radiant heat. First, this exothermic ring undergoes induction heating to reach a high-temperature state. The polycrystalline silicon rod is then heated using this radiant heat. After the temperature of the polycrystalline silicon rod increases to reach a state that enables transmission of electricity, the polycrystalline silicon releases heat on its own as a result of this induction heating. Once this state has been reached, the exothermic ring is receded from around the polycrystalline silicon rod. Thereafter, the polycrystalline silicon rod subject to direct induction heating, and the bottom end thereof melts. This molten bottom end is then fused to the seed crystal, and the single crystal thus grows.

SUMMARY OF THE INVENTION

Disclosure of the Invention

Problems to be Resolved by the Invention

A support member for supporting the aforementioned exothermic ring is supported on the housing wall to permit free rotation so that the exothermic ring is positioned closer to and receded from the polycrystalline silicon rod. In the single crystal production process using the FZ methods it is absolutely essential to suppress contamination from the members composing the apparatus. In the case of the susceptor material comprising metallic or sintered material (SiC coated carbon, tantalum, molybdenum, etc.) that is disclosed in the present invention, the susceptor itself becomes a source of contamination. Further, when the susceptor releases heat, the support member that supports the susceptor is also heated to a high temperature. As a result, this can lead to contamination from the support member. In addition, heat is transmitted to the sealing member in between the support member and the housing, causing the sealing properties to deteriorate and generating contamination from the sealing member. Moreover, a further problem is the deterioration in the quality of the single crystal silicon which results when the environment degrades due to mixing in of external gases when the sealing properties deteriorate.

The present invention was conceived in view of the above-described circumstances and has as its objective the prevention of contamination from heated elements and the prevention of contamination from the sealing member in between the support member and the housing, and the external environment by controlling a rise in the temperature of the support member. The present invention aims as a result to provide a higher quality single crystal silicon.

The apparatus for producing single crystal silicon according to the present invention is an apparatus for producing single crystal silicon comprising: a housing; a seed crystal holder that holds a seed crystal in the housing; a polycrystal holder that holds a polycrystalline silicon rod in the housing to oppose one end of the polycrystalline silicon rod to one end of the seed crystal held by the seed crystal holder; an induction heating coil that is disposed around the polycrystalline silicon rod for fusing the polycrystalline silicon rod, connecting the one end of the polycrystalline silicon rod to the one end of the seed crystal, and single-crystallizing the polycrystalline silicon rod connected to the seed crystal; an exothermic ring that has a conductive member capable of undergoing induction heating by the induction heating coil and a quartz-coated member covering the conductive member; a support member that supports the exothermic ring and passes through a wall of the housing in a rotatable manner; an operating device that rotates the support member and reciprocates the exothermic ring between:

i) a heating position where the exothermic ring is positioned close to the induction heating coil in between the seed crystal holder and the polycrystal holder, and ii) a stand-by position where the exothermic ring is receded from the heating position; a sealing member that is provided between the wall of the housing and the support member and maintains the air-tightness therebetween; and a cooling flow path that is formed in the support member and flows a cooling medium.

In other words, a design is provided in which the conductive member of the exothermic ring is covered with the quartz-coated member, and the cooling medium flows inside the support member which is holding the ring. As a result, when the exothermic ring is subjected to induction heating by the induction heating coil, that heat is cooled by the cooling medium inside the support member, making it possible to produce a high quality single crystal silicon with extremely little contamination.

The present invention's apparatus for producing single crystal silicon is the apparatus for producing single crystal silicon, wherein the support member has a double tube comprising an outer tube and an inner tube, and the cooling flow path is designed so that cooling media is supplied to ether the inner tube or the outer tube expelled from the tube which is not used for supply. As a result of this double tube structure, it is possible to continually supply cooling medium into the support member, making it possible to effectively cool the support member and the sealing member. In this case, it is acceptable to provide a design in which the cooling medium is supplied the cooling medium to between the outer tube and the inner tube, is returned at the bottom end of the support member, and is sent out the inner tube, for efficient cooling at the bottom end of the support member that is close to the exothermic ring.

In the present invention's apparatus for producing single crystal silicon, it is preferable if the conductive member of the exothermic ring is formed of carbon.

In addition, a space may be formed in between the conductive member and the quartz-coated member, with this space then evacuated to create a vacuum state. By forming this internal space, it is possible to prevent heat stress between the conductive member and the quartz-coated member. In addition, by providing a vacuum state within this internal space and deterioration of the conductive member is prevented.

Further, the present invention's apparatus for producing single crystal silicon may be provided with a design in which the exothermic ring has a cutout in a circumferential periphery thereof so that the polycrystalline silicon rod can pass through the cutout when the exothermic ring is moved between the heating position and the stand-by position by the operating device. When the exothermic ring is moved between the heating position and the stand-by position, the exothermic ring can move so that the cutout passes the polycrystalline silicon rod. Thus, it is possible to move only the exothermic ring, without changing the relative positional relationship between the polycrystalline silicon rod and the seed crystal.

Effects of the Invention

In the present invention's apparatus for producing single crystal silicon, the conductive member of the exothermic ring is covered with the quartz-coated member, and the cooling medium flows inside the support member that holds the exothermic ring As a result, the heat from the exothermic ring is cooled by the cooling medium inside the support member. Thus, contamination from the exothermic ring, the support member, and the sealing member between the support member and the housing, can be prevented. As a result, it is possible to produce a high quality single crystal silicon.

DETAILED DESCRIPTION OF THE INVENTION

Preferred Embodiments of the Present Invention

Preferred embodiments of the apparatus for producing single crystal silicon according to the present invention will now be explained with reference to the accompanying figures.

Figure 1:
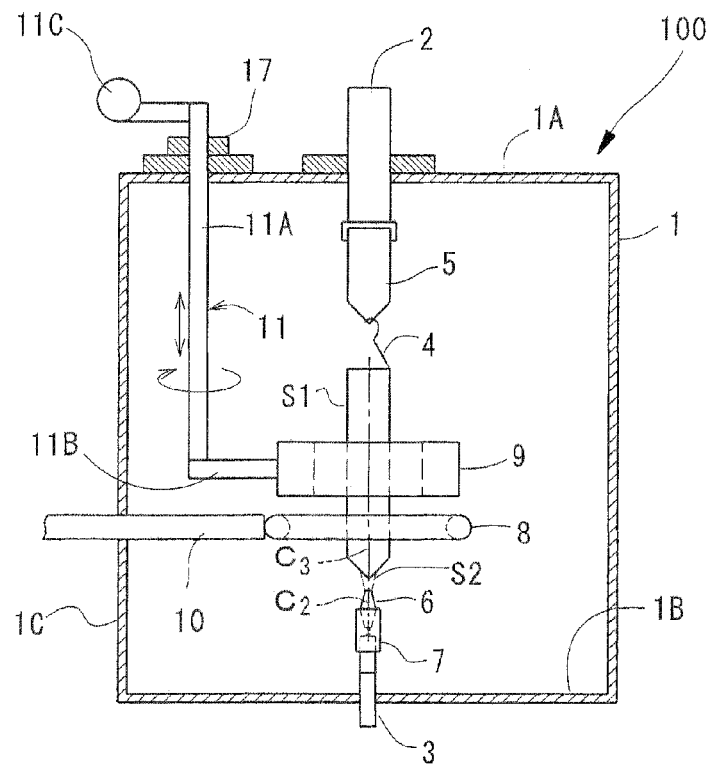
FIG. 1 is a schematic cross-sectional view showing the overall structure of the apparatus for producing single crystal silicon according to a first embodiment of the present invention.

FIG. 1 is a schematic structural view of an apparatus for producing single crystal silicon 100 according to the first embodiment. In the figure, numeric symbol 1 indicates a housing which is filled with an inert gas (argon gas). An upper drive shaft 2 is provided in the center of the top wall 1A of this housing for rotational driving and reciprocated driving in the vertical direction. In addition, a lower drive shaft 3 is provided to the bottom 1B of the housing 1 opposite the upper drive shaft 2 and so as to be on the same axis, for rotational driving and reciprocated driving in the vertical direction. A polycrystal holder 5 for holding the polycrystalline silicon rod S1 which is the sample material via a hoist 4 consisting of molybdenum wire is provided to the bottom end of the upper drive shaft 2. A seed crystal holder 7 for holding the seed crystal 6 for the silicon single crystal is provided at the top end of the lower drive shaft 3.

Figure 2:
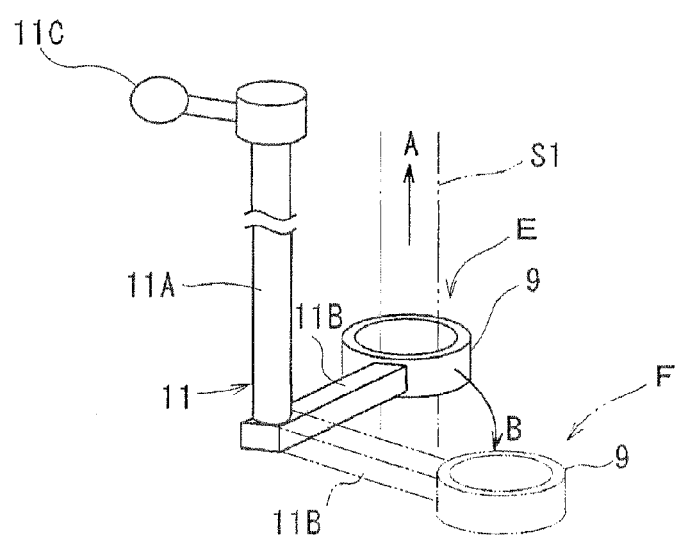
FIG. 2 is a perspective view showing the exothermic ring in FIG. 1 and the support member therefor.
Figure 3:
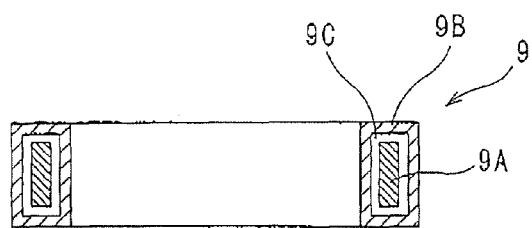
FIG. 3 is a vertical cross-sectional view of the exothermic ring in FIG. 1.

A high-frequency induction heating coil 8 and a quartz-coated exothermic ring 9 are provided in between the polycrystal holder 5 and the seed crystal holder 7 inside the housing 1. The high-frequency induction heating coil 8 is formed so that its overall shape is that of a discoid ring, and is held horizontally by a support rod 10 which is supported on a side wall 1C of the housing 1. The exothermic ring 9 has overall shape of a ring as shown in FIGS. 2 and 3, and comprising an conductive member 9A comprising carbon, and a quartz-coated member 9B which covers the conductive member 9A with an interval of space therebetween. This internal space 9C that is surrounded by the quartz-coated member 9B is evacuated to create a vacuum state on the order of $10^{-4} \sim 10^{-6}$ Pa.

This exothermic ring 9 is held horizontally at a position above the high-frequency induction heating coil 8 by a support member 11 which hangs downward from the top wall 1A of the housing 1. This support member 11 is formed in the shape of the letter L by a vertical part 11A and a horizontal part 11B. The top end of the vertical part 11A passes through the top wall 1A of the housing 1 and is supported on top wall 1A to permit rotation, raising and lowering. The exothermic ring 9 is fixed in place to the front end of the horizontal part 11B which is combined with the bottom end of the vertical part 11A. An operating device 11C, such as a lever or the like, is provided at the top end of the vertical part 11A which projects out from the top wall 1A of the housing 1. By manipulating the operating device 11C, the exothermic ring 9 held at the bottom end thereof can be moved slightly up or down, and can be subjected to reciprocating movement between a "heating position" (the position indicated by the symbol E in FIG. 2), which is disposed to the space between the polycrystal holder 5 and the seed crystal holder 7, and a "stand-by position" (the position indicated by the symbol F in the same figure) which is removed laterally from this space.

Figure 4:
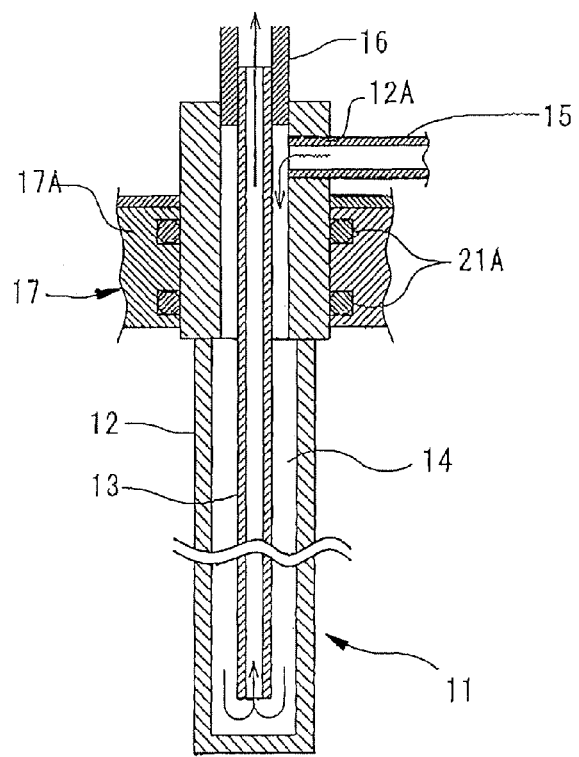
FIG. 4 is a vertical cross-sectional view of the internal structure of the support member in FIG. 1.

At least the vertical part 11A of the support member 11 is provided with a double tube structure comprising an outer tube 12 and an inner tube 13 such as shown in FIG. 4, with a cooling flow path 14 formed in the space of the double tube.

In this case, the bottom end of the outer tube 12 is sealed, but the bottom end of the inner tube 13 is open and is disposed at a position that is slightly distant from the bottom end of the outer tube 12. As a result, there is a state of continuation between the space inside the inner tube 13 and the ring-shaped space between the tubes 12, 13 at the bottom end of the support member 11. In addition, an external tube 15 for supplying a cooling medium such as cooled water from the outside is connected to an attachment hole 12A at the top of the outer tube 12, and an external tube 16 for expelling a cooling medium is connected at the top end of the inner tube 13. In other words, the cooling flow path 14 formed by the double tube is designed so that the cooling medium which is supplied from the external pipe 15 to the ring-shaped space between the outer tube 12 and the inner tube 13 is returned at the bottom end of the support member 11, passes through the inside of the inner tube 13, and is expelled to the outside from the external tube 16. The entirety of the support member 11 is thus cooled as a result of this type of circulation of the cooling medium.

Figure 5:
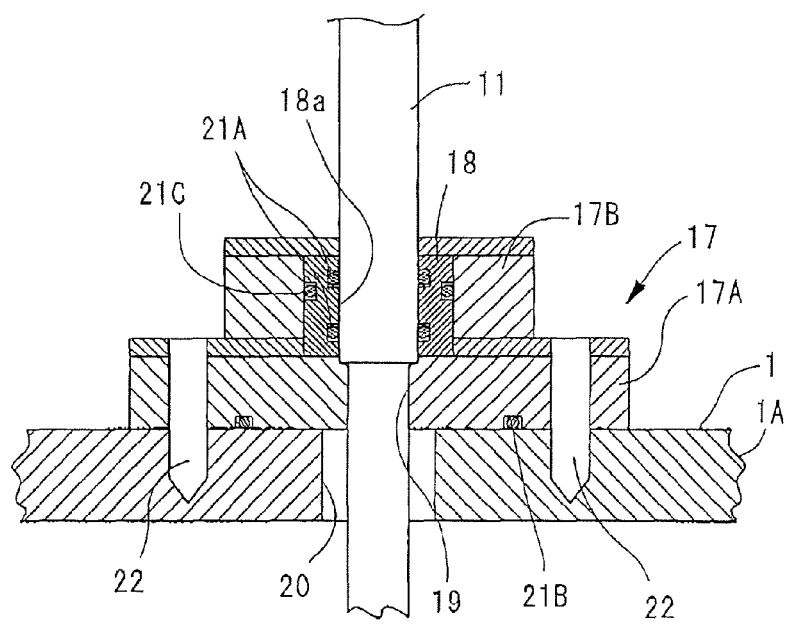
FIG. 5 is a vertical cross-sectional view showing the state of attachment of the support member with respect to the housing in FIG. 1.

The top end of the support member 11 is supported by a support block 17 that is provided so as to form a portion of the top wall 1A of the housing 1, as shown in FIG. 5. This support block 17 comprising a first block member 17A that is fixed in place to the upper surface of the top wall 1A of the housing 1, and a second block member 17B that is fixed in place on top of the first block member 17A. The support member 11 is disposed so as to pass through these block members 17A, 17B and the top wall 1A of the housing 1 in the vertical direction. In this case, a sleeve 18 is provided in a unitary manner with the block members 17A and 17B so as to form a penetrating hole in the block members 17A, 17B. The support member 11 is supported penetrating through the penetrating hole 18a of the sleeve 18, and passes thorough the holes 19,20 of the block member 17A and the top wall 1A of the housing 1, so as to be suspended within the housing 1. Sealing members 21A~21C, such as O-rings or the like, are provided in between the support member 11 and the inner peripheral surface of the penetrating hole 18a of the sleeve 18, in between the upper surface of the top wall 1A of the housing 1 and the bottom surface of the first block member 17A of the support block 17, and in between the sleeve 18 and the second block member 17B, for maintaining hermetic within the housing 1. In FIG. 5, the numeric symbol 22 indicates a screw that fixes the first block member 17A and the top wall 1A of the housing 1 in place in a unitary manner.

Figure 6:
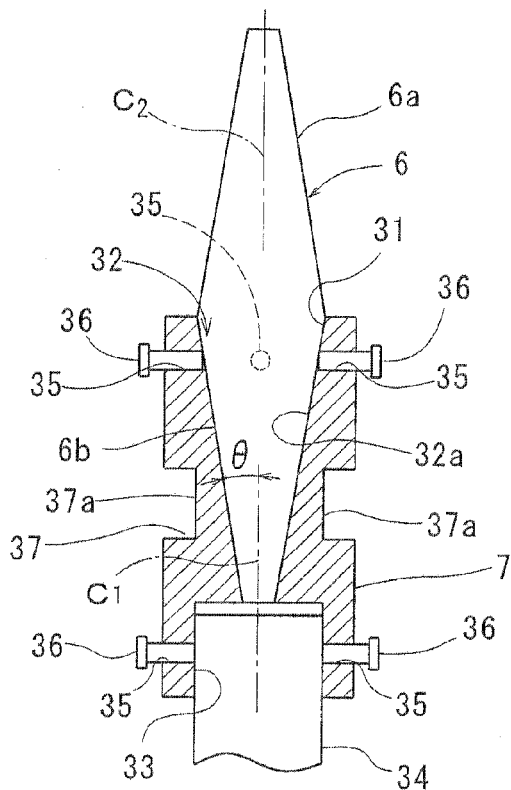
FIG. 6 is a vertical cross-sectional view showing an enlargement of the state in which the seed crystal is held by the seed crystal holder in FIG. 1.
Figure 7:
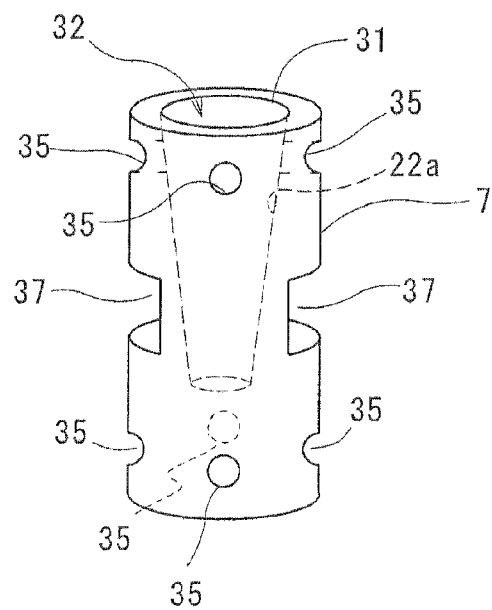
FIG. 7 is a perspective view showing the outer appearance of the seed crystal holder in FIG. 6.

The seed crystal holder 7 is formed of tantalum (Ta) and has the overall shape of a cylinder such as shown in FIGS. 6 and 7. A conical-upper housing aperture 32 is formed to the majority of the seed crystal holder 7, excluding the bottom end thereof, this conical upper housing aperture having a gradually widening diameter as it approaches the opening 31 at the top end of the seed crystal holder 7. A cylindrical lower housing aperture 33 is formed to the bottom end of the seed crystal holder 7. These housing apertures 32,33 are disposed on the same axial line $C_1$, with the seed crystal 6 housed inside the upper housing aperture 32 and the rod-shaped support member 34 consisting of quartz that is fixed in place to the top end of the lower drive shaft 3 attached in the lower housing aperture 33.

While the seed crystal 6 which is held by the seed crystal holder 7 is formed so that its overall shape is that of a rod, it is formed to be conical in shape, such that it narrows along the direction of its length from its center toward the respective ends, top end 6a and bottom portion 6b. The support member 34 is formed to be cylindrical in shape. The seed crystal holder 7 is attached on top of the support member 34, and the bottom end 6b of the seed crystal 6 is housed in the upper housing aperture 32. The axial line $C_2$ of the seed crystal 6 is disposed so as to be on the same line as the axial line $C_3$ of the polycrystalline silicon rod S1 which is held by polycrystal holder 5 above.

Four screw holes 35 extending in the radial direction are provided at 90° intervals along the circumferential direction at either end of the seed crystal holder 7. These screw holes 35 each pass through the wall of the seed crystal holder 7, and thereby communicate with the internal upper housing aperture 32 and lower housing aperture 33. The seed crystal 6 housed inside the upper housing aperture 32 is fixed in place by screwing into place set screws 36 via the upper screw holes 35. The support member 34 housed in the lower housing aperture 33 is fixed in place by screwing into place set screws 36 via lower screw holes 35.

Further, a tapered surface 32a is formed to the inner peripheral surface of the upper housing aperture 32 of the seed crystal holder 7, and the angle θ which this tapered surface 32a forms with the axial line $C_1$ of the upper housing aperture 32 is set to be in the range of 10~25°. The surface roughness of this tapered surface 32a is set to have an average roughness (Ra) in the range of 10~200 μm. When the angle of the tapered surface 32a is greater than 25°, the position of the seed crystal 6 cannot be stabilized, so that the seed crystal 6 readily slides during rotation. When the angle of the tapered surface 32a is less than 10°, core deviation can readily occur. The angle of the tapered surface 32a is more preferably set to be in the range of 17~18°. Further, by setting the surface roughness to be in the range of 10~200 μm, the seed crystal 6 can be held with an appropriate frictional force during rotation, so that its position can be accurately maintained.

Respective concavities 37 are formed to the outer periphery of the seed crystal holder 7 at the center position along its length, these concavities 37 being formed at symmetrical positions separated 180° from one another in the circumferential direction. These concavities 31 are for disposing the front end of a pair of pliers or other such tool used when fixing the seed holder 7 in place to the support member 34, holding the seed crystal 6 inside the housing aperture 32, etc. The concavities 37 are formed to be a rectangular-shaped groove in cross-section, and are provided with a flat surface 37a parallel to the axis direction for enabling contact with the front end portion of a tool.

The method for producing a single crystal silicon using the apparatus for producing single crystal 100 designed as described above will now be explained according to the sequence of steps below.

(1) The hoist 4 is attached to the polycrystalline silicon rod S1 which is the sample material, so that the polycrystalline silicon rod S1 is supported by the polycrystal holder 5. The seed crystal 6 is attached to the seed crystal holder 7. The bottom end 6b of the seed crystal 6 is inserted into the upper housing aperture 32 of the seed crystal holder 7, so that the tapered surface 32a of the upper housing aperture 32 comes into contact with the outer peripheral surface of the seed crystal 6, and the cores thereof are automatically aligned. The set screws 36 are employed to fix the seed crystal 6 in place in this stored state, with the core alignment maintained.

(2) The exothermic ring 9 is disposed to a position (heating position E) that is between the polycrystalline silicon rod S1 and the seed crystal 6 which are disposed on the sane axis.

(3) The upper drive shaft 2 is descended, the polycrystalline silicon rod S1 which is the sample material is passed through the exothermic ring 9, and the polycrystalline silicon rod S1 is positioned so that the bottom end thereof approached the high-frequency induction heating coil 8 from above.

(4) The door (not shown) of the housing 1 is closed, sealing shut the inside of the housing 1. Following evacuation, the inside of the housing 1 is filled with an inert gas.

(5) By turning on electricity through the high-frequency induction heating coil 8, the exothermic ring 9 is heated, and preheating of the polycrystalline silicon rod S1 is carried out by the radiant heat from the exothermic ring 9. This preheating is carried out until the bottom end of the polycrystalline silicon rod S1 becomes glowing.

(6) The upper drive shaft 2 is raised as shown by the arrow A in FIG. 2, and the polycrystalline silicon rod S1 moves away from the seed crystal 6. Next, the exothermic ring 9 is receded as shown by arrow B from the interval of space that is formed between the polycrystalline silicon rod S1 and the seed crystal 6, a position near the side wall 1C of the housing 1 (i.e., stand-by position F). Next, the upper drive shaft 2 is lowered, so that the polycrystalline silicon rod S1 is lowered to the vicinity of the high-frequency induction heating coil 8.

(7) The bottom end of the polycrystalline silicon rod S1 is melted.

(8) By raising the lower drive shaft 3, the seed crystal 6 approaches the polycrystalline silicon rod S1. When the bottom end of the polycrystalline rod S1 is completely melted, the seed crystal 6 and the polycrystalline silicon rod S1 are positioned closer to one another, so that the heat of the polycrystalline silicon rod S1 is transmitted to the seed crystal 6, and the top end surface of the seed crystal 6 melts.

(9) The seed crystal 6 is rotated by rotational driving of the lower drive shaft 3.

(10) The melted part on the bottom end of the polycrystalline silicon rod S1 and the seed crystal 6 are sufficiently adapted as the shape of the melted part on the bottom end of the polycrystalline silicon rod S1 is adjusted.

(11) The upper drive shaft 2 and the lower drive shaft 3 are simultaneously moved along the axial direction. As a result, the melted part of the polycrystalline silicon rod S1 undergoes relative displacement in the vertical direction with respect to the high-frequency induction heating coil 8. Thus, the single crystal silicon S2 grows on the lower drive shaft 3.

(12) Once the single crystal silicon S2 is sufficiently formed, driving of the upper drive shaft 2 and the lower drive shaft 3, and conduction through the high-frequency induction heating coil 8, are halted. Thereafter, the formed single crystal silicon is removed, and cooled in a rapid cooling device.

As a result of the above-described apparatus for single crystal silicon 100, the seed crystal 6, which has a conical shape at either portion 6a, 6b, is inserted into the upper housing aperture 32 of the seed crystal holder 7. As a result, the conically shaped outer peripheral surface of the seed crystal 6 comes into contact over its entire periphery with the tapered surface 32a of the housing aperture 32. Accordingly, both axial lines $C_1, C_2$ are correctly aligned. As a result, the axial line $C_2$ of the seed crystal 6 and the axial line $C_3$ of the polycrystalline silicon rod which is disposed above are correctly aligned. In other words, by simply pushing the seed crystal 6 into the housing aperture 32, the seed crystal 6 is housed with the axial lines $C_1, C_2$ in a state of alignment, and the axial line $C_3$ of the polycrystalline silicon rod S1 above is also aligned. As a result, the time of work for attaching the seed crystal 6 is greatly reduced. Further, by affixing the set screws 36 when the seed crystal 6 is in the housed state, the seed crystal 6 is held over its entire periphery by the tapered surface 32a and can be fixed in place with certainty by further pressing force by the set screws 36.

When the upper housing aperture is straight, the seed crystal readily moves left and right within the clearance in the case where the seed crystal is housed and then stopped by the set screws. However, by giving the housing aperture a tapered surface, the entire periphery of the seed crystal is in contact with the tapered surface, so that movement to the left or right is difficult. Accordingly, the operation of aligning the core with the polycrystalline silicon rod is facilitated.

Further, the polycrystalline silicon rod S1 is supported by the polycrystal holder 7 so as to have the same axis as the seed crystal 6. Next, the exothermic ring 9 is disposed to the "heating position E" between the polycrystal holder 5 and the seed crystal holder 7 as shown in FIG. 1. This exothermic ring 9 is subjected to induction heating by the high-frequency induction heating coil 8, to reach a high temperature state. As a result, the polycrystalline silicon rod S1 is heated by the radiant heat from the exothermic ring 9. Further, the temperature of the polycrystalline silicon rod S1 raises and the bottom end thereof becomes glowing. Thereafter, with the polycrystalline silicon rod S1 pulled upward, the support member 11 is rotated and the exothermic ring 9 is receded from between the polycrystal holder 5 and the seed crystal holder 7, to the "stand-by position F". The polycrystalline silicon rod S1 is heated only by induction heating from the high-frequency induction heating coil 8, to grow the single crystal silicon. Because the exothermic ring 9 is covered with quartz, contamination from the ring member is extremely small, making it possible to produce extremely high quality single crystal silicon.

The seed crystal 6 is rotated during the process of growing the single crystal silicon. However, since the entire periphery of the seed crystal 6 is held by the tapered surface 32a of the housing aperture 22 during this time, slipping does not occur and the state of core alignment can be maintained. In this case, the roughness of the tapered surface is set to be in the range of an average roughness (Ra) of 10~200 μm. By setting the roughness to be in this range, the frictional force between the tapered surface of the housing aperture and the seed crystal increases, so that slipping during rotation can be prevented with certainty.

During production of the seed crystal, the cooling medium flows through the cooling flow path 14 inside the support member 11 which is in the form of a double tube. Thus, even if the exothermic ring 9 is heated by the high-frequency induction heating coil 8, that heat is prevented from reaching the sealing member 21A which seals the space between the support member 11 and the housing 1. As a result, contamination from the support member 11 is prevented. Further, the sealing member 21A does not become overheated, so that a deterioration in the sealing member 21A and a decline in its performance can be prevented. Thus, contamination from the sealing member 21A is prevented and an extension in the useful life of the sealing member 21A can be anticipated.

With regard to the exothermic ring 9 itself, since the conductive member 9A consisting of carbon is covered by the quartz-coated member 9B, it is possible to prevent contamination of the work environment. In addition, by creating a vacuum state in the space 9C in between the conductive member 9A and the quartz-coated member 913, the heat effect on the polycrystalline silicon rod S1 is high and deterioration in the conductive member caused by a residual moisture component in the case of an air environment can be prevented. In addition, by separating the conductive member 9A and the quartz-coated member 9B, it is possible to prevent the generation of stress that accompanies the difference in thermal expansion between these two elements.

In the above-described apparatus for single crystal silicon 100, the support member 11 is formed of a double tube consisting of an inner tube 12 and an outer tube 13. A cooling medium is supplied to one of either the inner tube 12 or the outer tube 13, with this cooling medium then passing through the other tube to be expelled. Because of this design, it is possible to continuously supply the cooling medium to the support member 11, so that the sealing member can be effectively cooled.

Due to these synergistic effects, the soundness of the apparatus for producing single crystal silicon can be maintained over a long period of time.

Figure 8:
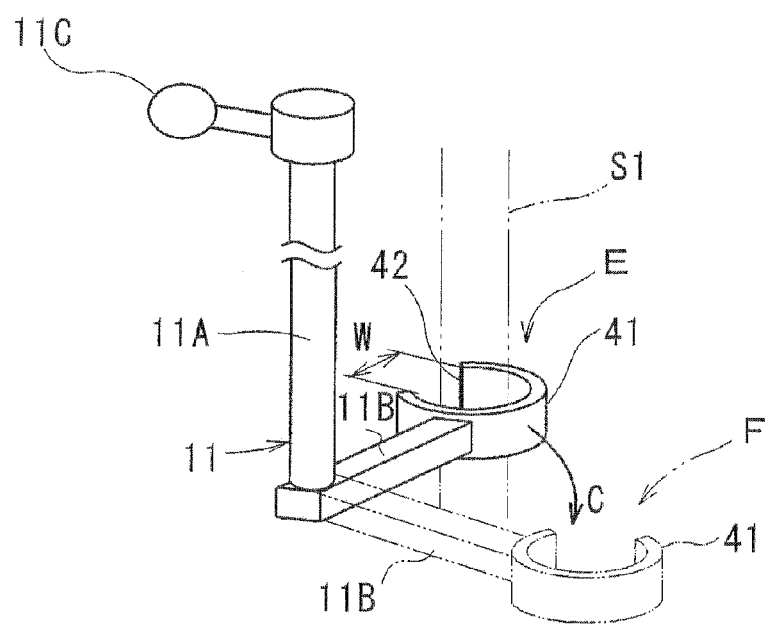
FIG. 8 is the same perspective view as FIG. 2, showing the exothermic ring of second embodiment of the present invention, and the support member therefor.

FIG. 8 shows another embodiment of the present invention. In this embodiment, the exothermic ring 41 differs from the exothermic ring 9 of the first embodiment shown in FIGS. 1~3 in that a cutout 42 is formed to part of the periphery. The space interval W of this cutout 42 is formed to be larger than the diameter of the polycrystalline silicon rod S1, so that the polycrystalline silicon rode S1 can pass through the cutout 42. The position of the cutout 42 is disposed so that, when the operating lever 11C is manipulated to cause reciprocating movement of the exothermic ring 41, the polycrystalline silicon rod S1 passes through the cutout 42 when the exothermic ring 41 is moved between the heating position B (equivalent to the center of the support for the polycrystal holder 5 and the axial line $C_1$ of the seed crystal holder 7) and the stand-by position F by the operating device.

Accordingly, in the production step (6) in the first embodiment above, the polycrystalline silicon rod S1 is raised and moved away from the seed crystal 6 prior to moving the exothermic ring 9 from the heating position E to the stand-by position F. As a result, it was necessary to maintain a space interval between the polycrystalline silicon rod S1 and the seed crystal 6 that would enable passage of the exothermic ring. However, in second embodiment, by simply moving the exothermic ring 41 as shown by the arrow C in FIG. 8, without raising the polycrystalline silicon rod S1, it is possible to move the exothermic ring 41 from the heating position E to the stand-by position F shown by the dashed line. Accordingly, it is possible to move on to the next step while maintaining the bottom end of the polycrystalline silicon rod S1 in the glowing state. Thus, operability is good.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims. For example, in the cooling flow path 14 of the support member 11 in the first embodiment, the cooling medium was supplied from the outside to the outer tube 12, after which the cooling medium was expelled from the inner tube 13. However, it is also acceptable to supply the cooling medium from the outside to the inner tube 13, and then expel the cooling medium from the outer tube 12. In addition, an operating device such as a lever was provided for rotating, raising or lowering the support member 11. However, it is also acceptable to provide an operating device consisting of a driving mechanism that incorporates an electric motor or a speed reducer. In addition, carbon, molybdem or the like may be suitably employed for the conductive member of the exothermic ring, provided that the conductive member is one which can undergo induced heating by an induction heating coil and which has a higher melting point than that of silicon.

Moreover, in the seed crystal holder 7 in the first embodiment, the upper housing aperture 32 is formed with a tapered surface 32a which is continuous to the opening. However, provided that at least a portion of the tapered surface which can come into contact with the entire circumference of the outer periphery of the seed crystal is formed, then the vicinity of the opening can be in the form of a cylinder. In addition, the seed crystal inserted into the housing aperture was fixed in place with four set screws, however, it is also acceptable to fix the seed crystal in place using three set screws.

What is claimed is:

1. An apparatus for producing single crystal silicon comprising:
    a housing;
    a seed crystal holder that holds a seed crystal in the housing;
    a polycrystal holder that holds a polycrystalline silicon rod in the housing to place one end of the polycrystalline silicon rod opposite to one end of the seed crystal held by the seed crystal holder;
    an induction heating coil that is disposed around the polycrystalline silicon rod for fusing the polycrystalline silicon rod, connecting the one end of the polycrystalline silicon rod to the one end of the seed crystal, and single-crystallizing the polycrystalline silicon rod connected to the seed crystal;
    an exothermic ring that has a conductive member capable of undergoing induction heating by the induction heating coil and a quartz-coated member covering the conductive member;
    a support member that supports the exothermic ring and passes through a wall of the housing in a rotatable manner;
    an operating device that rotates the support member and reciprocates the exothermic ring between:
        i) a heating position where the exothermic ring is positioned close to the induction heating coil in between the seed crystal holder and the polycrystal holder, and
        ii) a stand-by position where the exothermic ring is receded from the heating position;
    a sealing member that is provided between the wall of the housing and the support member and maintains the hermetic therebetween; and
    a cooling flow path that is formed in the support member and flows a cooling medium.

2. An apparatus for producing single crystal silicon according to claim 1, wherein the support member has a double tube comprising an outer tube and an inner tube, and the cooling flow path is designed so that cooling media is supplied to ether the inner tube or the outer tube expelled from the tube which is not used for supply.

3. An apparatus for producing single crystal silicon according to claim 1, wherein the conductive member of the exothermic ring is formed of carbon.

4. An apparatus for producing single crystal silicon according to claim 1, wherein a space is formed between the conductive member and the quartz-coated member, and the space is evacuated in a vacuum state.

5. An apparatus for producing single crystal silicon according to claim 1, wherein the exothermic ring has a cutout in a circumferential periphery thereof so that the polycrystalline silicon rod can pass through the cutout when the exothermic ring is moved between the heating position and the stand-by position by the operating device.

* * * * *